(12) United States Patent
Murakami et al.

(10) Patent No.: US 6,333,111 B1
(45) Date of Patent: Dec. 25, 2001

(54) METHOD OF PRODUCING LAYERED ALUMINUM FINE PARTICLES AND USE THEREOF

(75) Inventors: Junichi Murakami; Yutaka Tai; Kazuki Yoshimura; Kazuo Igarashi; Sakae Tanemura, all of Aichi; Masahiro Goto, Osaka, all of (JP)

(73) Assignee: Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/524,743

(22) Filed: Mar. 13, 2000

Related U.S. Application Data

(62) Division of application No. 09/022,006, filed on Feb. 11, 1998, now Pat. No. 6,146,505.

(30) Foreign Application Priority Data

Mar. 10, 1997 (JP) .................................................. 9-74604

(51) Int. Cl.$^7$ ...................................................... G11B 5/66
(52) U.S. Cl. ...................... 428/404; 428/692; 428/694 T; 428/900; 204/192.2; 204/192.22; 204/192.24; 204/192.25
(58) Field of Search ............................ 204/192.2, 192.22, 204/192.24, 192.25; 428/404, 692, 694 T, 900

(56) References Cited

U.S. PATENT DOCUMENTS

| | | | |
|---|---|---|---|
| 4,125,446 | * 11/1978 | Hartsough | 204/192.15 |
| 4,559,096 | 12/1985 | Friedman et al. | 204/192.34 |
| 4,849,081 | * 7/1989 | Ross | 204/192.22 |
| 5,651,865 | 7/1997 | Sellers | 204/192.22 |

OTHER PUBLICATIONS

"Physics and Applications of Small–Capacitance Tunnel Junction: Introduction to Single–Electron Electronris," Masahito Ueda: Oyo Butsuri, 62, pp. 889–897 (1993).

R. Wilkins, et al., "Scanning–Tunneling–Microscope Observations of Coulomb Blockade and Oxide Polarization in Small Metal Droplets," vol. 63, No. 7, Aug. 14, 1998, pp. 801–804.

S. Wilson, et al., Solid State Chem., 34 3 15 (1980) Aluminum Oxide, pp. 35–121.

Kimoto, K., "External Shapes and Crystal Structures of Fine Particles Formed by Evaporation in Inert Gas at Low Pressures," *Ultrafine Particles*, Solid Physics and Metal Physics Seminars Special Edition, Agne Technology Center (1984), pp. 68–79.

Kaito, C., "Structure and Growth of Fine Oxide Particles," *Ultrafine Particles*, Solid Physics and Metal Physics Seminars Special Edition, Agne Technology Center (1984), pp. 80–84.

Wada, N., "Condensation Mechanism in Gas Evaporation," *Ultrafine Particles*, Solid Physics and Metal Physics Seminars Special Edition, Agne Technology Center (1984), p. 85.

H. Haberland, et al., "Energetic Cluster Impact (ECI): New Features in Deposition Technology," Proceedings of the Second Int'l Conf. On Beam Processing of Adv. Mat, Cleveland, Ohio, pp. 69–75, Feb. 1996.

* cited by examiner

*Primary Examiner*—Leszek Kiliman
(74) *Attorney, Agent, or Firm*—Oblon, Spivak, McClelland, Maier & Neustadt, P.C.

(57) ABSTRACT

The present invention provides a method for producing layered aluminum fine particles, and applications to single electron tunneling quantum devices, and the present invention further relates to a method for producing spherical metallic aluminum fine particles (layered aluminum fine particles), characterized in that metallic aluminum is supplied into a mixed gas of helium and $1\times10^{-7}$ to $3\times10^{-7}$ torr water vapor by sputtering induced by argon gas discharge to generate aggregates, after which this product is released into a vacuum to generate single crystals in which the surface layer is covered with alumina.

6 Claims, 3 Drawing Sheets

METHOD OF PRODUCING LAYERED ALUMINUM FINE PARTICLES AND USE THEREOF

This application is a Division of application Ser. No. 09/022,006 Filed on Feb. 11, 1998, now U.S. Pat. No. 6,146,505.

DISCLOSURE OF THE INVENTION

This invention relates to a convenient and efficient method for producing spherical layered aluminum fine particles, the surface layer of which is covered with several nanometers of alumina, the interior of which is metallic aluminum fine crystals, and which are useful for an element of a quantum device that utilizes a single electron tunneling phenomenon. More particularly, the present invention relates to a method for producing layered aluminum fine particles using a fine particle generating device that features magnetron sputtering; layered aluminum fine particles obtained by this method; and the application of these layered aluminum fine particles to a single electron tunneling device element.

BACKGROUND OF THE INVENTION

The production of elements on the sub-micron order is considered the limit with today's semiconductor technology for increasing density and integration, and some technique completely different from conventional fine processing technology (such as lithography) is needed in order to create even finer elements. It is believed that if the elements of a device could be smaller than sub-micron, then it would be possible to fabricate a quantum device (single electron tunneling device) that would control individual electrons, rather than controlling the flow of groups of electrons as in semiconductors produced up to now, and this has become an area of fervent research of late (publication 1).

The layered aluminum fine particles obtained with the present invention are single crystals of metallic aluminum whose surface is covered with an oxide insulator (alumina), and when these are placed on a substrate, it should be possible to create an electronic device based on single electron tunneling, which utilizes the passage of electrons one by one through this insulation layer (publication 2: an example is given of single electron tunneling in metallic ultrafine particles placed on a substrate). Therefore, these layered aluminum fine particles are believed to contribute greatly to obtaining an ultrafine semiconductor intended for a single electron tunneling quantum device. Most conventional methods for manufacturing fine particles containing aluminum involved evaporation in a gas method (publication 3: the generation of ultrafine particles by evaporation in a dilute gas method is discussed), but the fine particles obtained with these methods were all fine particles of alumina, and there are no cases of the production of layered aluminium fine particles that can be used for elements in a quantum device that utilizes single electron tunneling, such as are obtained with the present invention.

In view of this, in an effort to solve the above problem, the inventors used a fine particle generating device featuring magnetron sputtering to generate layered aluminum fine particles, and analyzed the particles thus generated using a transmission electron microscope (TEM) and electron beam diffraction. They also examined the dependence of particle size on the shape of the fine particle generating source, the temperature, and so on.

As a result, it was learned that when the distance from the aluminum sputtering target to the aperture attached to the distal end of the generating source is set at about 100 mm, and the aperture vicinity is cooled with liquid nitrogen, layered aluminum fine particles with a diameter of about 5 to 500 nm are generated through the aperture.

Furthermore, the inventors arrived at the present invention upon discovering that when the vicinity of the outlet from the fine particle generating source is not cooled with liquid nitrogen, layered aluminum fine particles the same as those mentioned above can be generated by shortening the distance between the aluminum sputtering target and the aperture to about 30 to 50 mm.

SUMMARY OF THE INVENTION

The present invention provides a method for producing layered aluminum fine particles, and applications to single electron tunneling quantum devices. The present invention further relates to a method for producing spherical metallic aluminum fine particles (layered aluminum fine particles), characterized in that metallic aluminum is supplied into a mixed gas of helium and $1\times10^{-7}$ to $3\times10^{-7}$ torr water vapor by sputtering induced by argon gas discharge to generate aggregates, after which this product is released into a vacuum to generate single crystals in which the surface layer is covered with alumina; a method for producing layered aluminum fine particles with a particle diameter of 5 to 500 nm, characterized in that the above-mentioned layered aluminum fine particles are placed in a flow of helium gas, released into a vacuum via an aperture, and deposited directly onto a substrate; a method for producing the above-mentioned layered aluminum fine microparticles, wherein the vicinity of the outlet from the particle generating source is cooled with liquid nitrogen, or the distance between the aluminum target and the aperture is set at 30 to 50 mm; layered aluminum fine particles obtained by the above methods; and a single electron tunneling quantum device element that makes use of layered aluminum fine particles obtained by the above methods.

DETAILED DESCRIPTION OF THE INVENTION

An object of the present invention is to provide a convenient and efficient method for producing metallic aluminum fine particles, with which single electron tunneling control is possible, and whose surface layer is an extremely thin insulation layer.

In order to solve the above problem, the present invention is such that metallic aluminum is supplied into a mixed gas of helium and $1\times10^{-7}$ to $3\times10^{-7}$ torr water vapor by sputtering induced by argon gas discharge to generate aggregates by impact with the helium yielding aluminum fine particles (single crystals). The surface of the fine particles is oxidized into a surface layer of alumina through the action of the trace amount of water vapor contained in the helium gas here, and this is how layered aluminum fine particles are produced. Also, the present invention is a method for producing layered aluminum fine particles with a particle diameter of 5 to 500 nm, characterized in that the above-mentioned particles are placed in a flow of helium gas, released into a vacuum via an aperture, and deposited directly onto a substrate. A preferred embodiment of this is a method for producing layered aluminum fine particles in which the vicinity of the outlet from the particle generating source is cooled with liquid nitrogen, or the distance between the aluminum target and the aperture is set at 30 to 50 mm. Other embodiments of the present invention are the layered aluminum fine particles obtained by the above method, and the application thereof to a single electron tunneling quantum device element.

The present invention will now be described in further detail.

In the present invention, metallic aluminum is supplied into a mixed gas of helium and $1\times10^{-7}$ to $3\times10^{-7}$ torr water vapor by sputtering induced by argon gas discharge to generate aggregates by impact with the helium yielding aluminum fine particles. After this, the surface layer of the microparticles is converted into alumina through the action of the trace amount of water contained in the helium gas, as a result of which spherical fine particles are generated that are covered with several nanometers of alumina surface layer, and that have metallic aluminum single crystals in the interior. A method for producing fine particle that makes use of a sputter gun is an effective method for producing an actual thin film sample because it allows a large quantity of fine particles to be generated continuously (magnetron sputtering gas aggregation method). This has been proven in Germany by Helmut Haberland (H. Haberland, M. Moseler, Y. Qiang, O. Rattunde, Y. Thurner, and Th. Reiners: Proceedings of the Conference on Beam Proceedings of Advanced Materials, Cleveland, Ohio, USA, pp. 1–7 (1995)).

FIG. 1 is a concept diagram of the fine particle source. As shown in the figure, the magnetron gun is positioned inside a stainless steel tube. An aperture (1 to 5 mm in diameter) is attached to the distal end of this tube, and the generated fine particles are taken out through this aperture.

The distal end portion of the particle generating source can be cooled with liquid nitrogen in order to lower the temperature of the helium gas.

Aluminum atoms are sputtered from the metallic aluminum target (a disk 50 mm in diameter and 3 mm thick) by direct current discharge of argon gas ($4\times10^{-3}$ torr). Helium gas (10 torr) fills the area around the sputter gun, and aggregation occurs in this area as a result of impact with the helium gas, thus generating aluminum fine particles. The surface of these fine particles is oxidized into alumina by the trace amount (about $1\times10^{-7}$ to $3\times10^{-7}$ torr) of water vapor present in the helium gas, resulting in the generation of spherical layered aluminum fine particles in which the surface layer is covered by alumina with a thickness of 1 to 5 nm, and the interior is metallic aluminum single crystals. The helium gas also serves to push the fine particles out of the particle generating source and into the vacuum tank. The stainless steel tube is position in the middle of the chamber, and the distance from the aluminum target to the outlet from this tube is 30 to 150 mm. The chamber is evacuated with an oil diffusion pump (5000 L/sec).

In the present invention, the above apparatus and conditions are given as favorable examples, and sputtering conditions include an argon gas pressure of $4\times10^{-3}$ to 10 torr, a direct current discharge of 100 to 600 V and 0.1 to 0.5 A, an aluminum target diameter of 30 to 50 mm, a helium gas pressure of 0 to 10 torr, and a water vapor pressure of $1\times10^{-7}$ to $3\times10^{-7}$ torr. Almost no oxide film will be formed on the particle surface layer if the water vapor pressure is below the range given above, and it is undesirable for the above range to be exceeded because the metallic aluminum in the particle interior will all be oxidized. A favorable example of an apparatus is one in which the diameter of the above-mentioned aperture is 1 to 5 mm and the metal tube is made of stainless steel, copper, or the like.

Favorable examples of the substrate on which the layered aluminum fine particles are deposited include copper, aluminum, another such metals and silicon and other semiconductors, while favorable configurations thereof include substrates of single crystals and polycrystals.

The distance from the fine particle generating source to the substrate is about 10 mm. The vicinity of the outlet from the fine particle generating source can be cooled with liquid nitrogen to between −60° C. and −180° C.

The energy required when the generated fine particles are placed in a flow of helium gas, released into a vacuum through the aperture, and deposited directly on the substrate is 0.05 eV or less per atom constituting the fine particles. Accordingly, the fine particles can be deposited on the substrate without their layered structure of spherical structure being altered.

EXAMPLES

Figure 1:
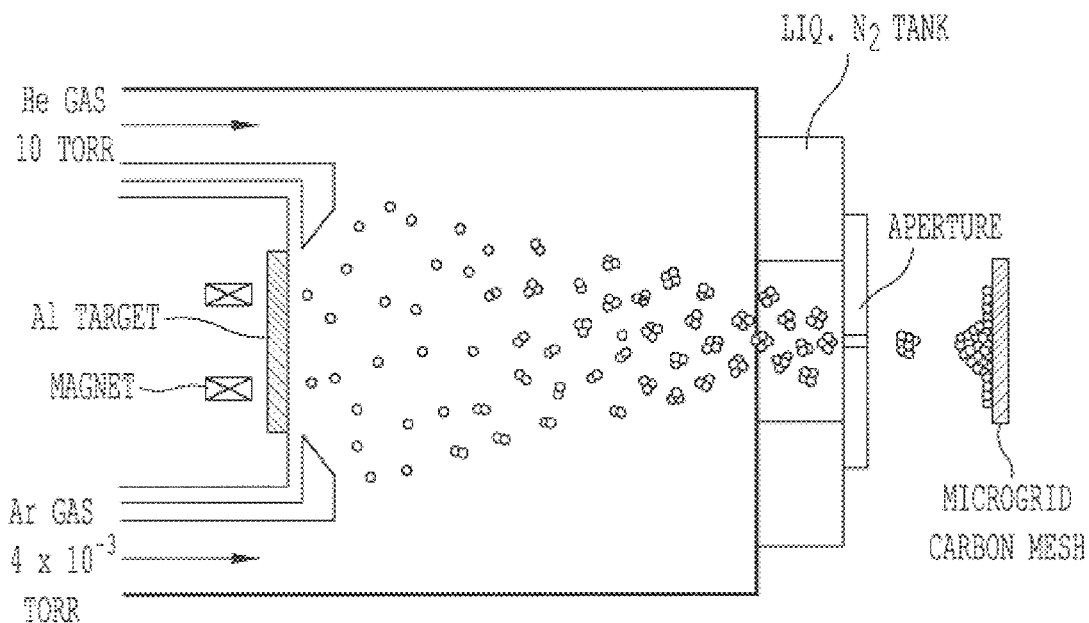
FIG. 1 illustrates a fine particle generating device in which magnetron sputtering is used.

The present invention will now be described on the basis of examples, but the present invention is not limited by these examples.

Example (2) Generation of Layered Aluminum Fine Particles

Aluminum atoms were sputtered from an aluminum target (50 mm diameter) by the direct current discharge (220 V, 0.4 A) of argon gas (99.99% purity, $4\times10^{-3}$ torr) introduced by a mass flow meter, these atoms were supplied to a mixed gas of helium gas (99.99% purity, 10 torr) and water vapor ($1\times10^{-7}$ torr) introduced by a mass flow meter, and the aluminum atoms were made to aggregate in this atmosphere to generate metallic aluminum fine particles, after which the particles were released into a vacuum through an aperture (2 mm diameter). In this case, the vicinity of the outlet from the particle generating source was cooled with liquid nitrogen, and the distance between the aperture and the aluminum target was 100 mm. Cooling of the vicinity of the outlet from the particle generating source with liquid nitrogen to between −60° C. and −180° C. allowed the amount of water vapor inside the generating source to be set at $1\times10^{-7}$ to $3\times10^{-7}$ torr, which is optimal for the generation of layered aluminum fine particles.

Furthermore, it was found that when the vicinity of the outlet from the fine particle generating source is not cooled with liquid nitrogen, layered aluminum fine particles the same as those mentioned above can still be generated by shortening the distance between the aluminum target and the aperture to about 30 to 50 mm. This makes it possible to prevent the generated aluminum metal fine particles from reacting with excess water vapor and becoming alumina.

In order to observe the fine particles by TEM, a copper mesh equipped with a carbon thin film was exposed to a fine particle beam for 30 to 60 minutes. The distance between the fine particle source outlet and the mesh was 10 mm. This sample was used to analyze the fine particles deposited on the mesh by TEM (100 kV and 200 kV (Hitachi HF-2000)).

(2) Analysis of Layered Aluminum Fine Particles by TEM

Figure 2:
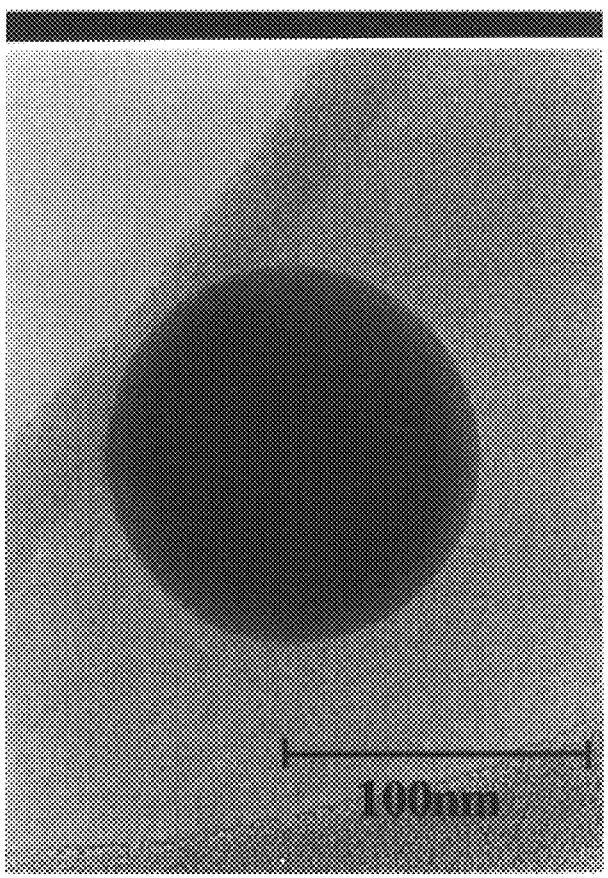
FIG. 2 is a TEM image of the layered aluminum fine particles that are generated.
Figure 3:
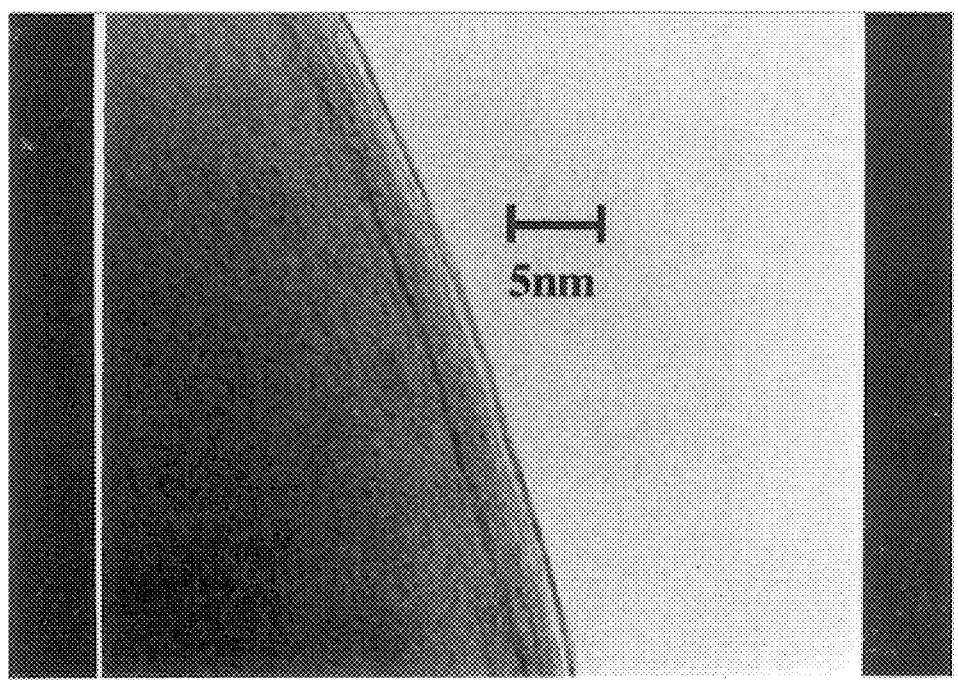
FIG. 3 is a TEM image of the surface layer portion of the layered aluminum fine particles.

FIG. 2 is a TEM image of the layered aluminum fine particles that were generated. These particles were generated at normal temperature and with the distance between the aluminum target and the aperture set at 30 mm. As is clear from the figure, the diameter of the particles was found to be approximately 120 nm, and the shape thereof to be spherical. It can also be seen that the surface layer thereof consists of a layer several nanometers in thickness that is different from the center portion. FIG. 3 is a TEM image in which the vicinity of the surface layer of the generated fine particles has been enlarged. It can be seen that the surface layer and the center portion are distinctly separate.

Figure 4:
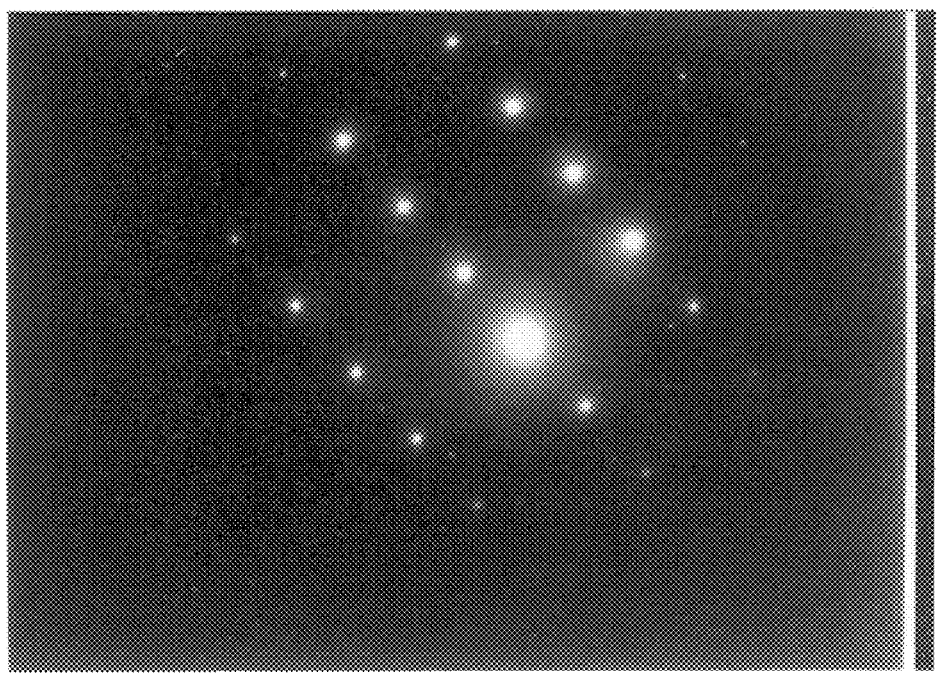
FIG. 4 is the electron diffraction pattern (particle structure) of the interior of the layered aluminum fine particles.

Next, FIG. 4 is the electron diffraction pattern from the center portion of the fine particles. It was found that the diffraction spots appearing in the figure can be explained as diffraction spots from the (111) plane of aluminum fcc single crystals (publication 4). It was concluded from these results that the center portion of the generated fine particles was single crystals of metallic aluminum.

Figure 5:
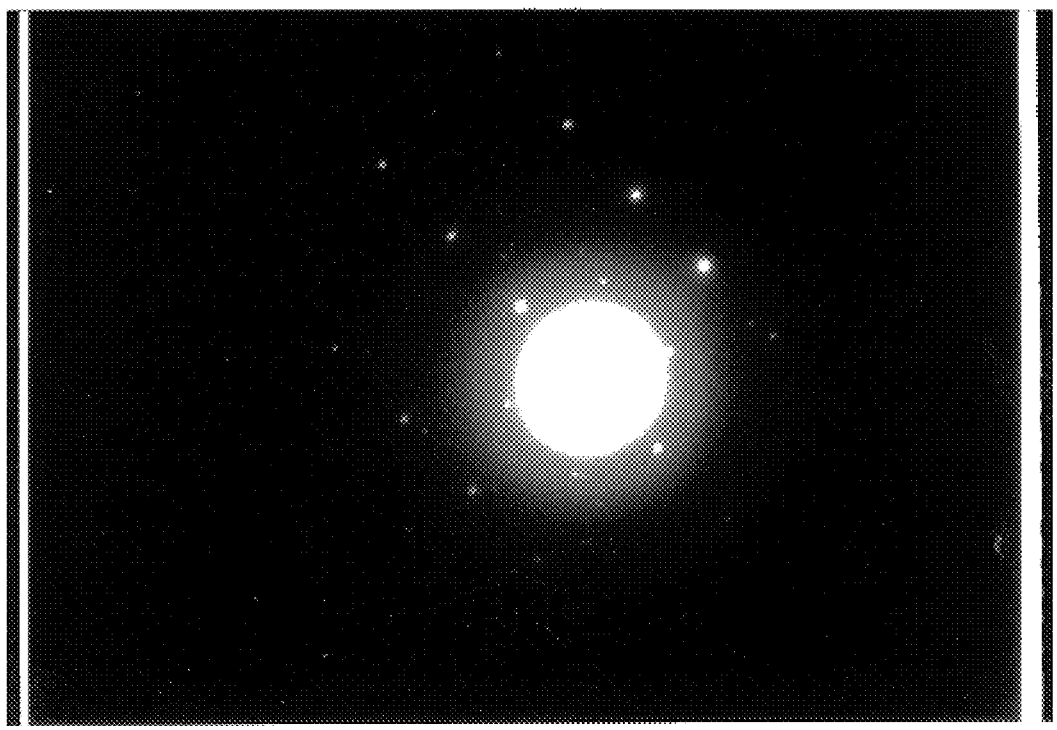
FIG. 5 is the electron diffraction pattern (particle structure) of the surface layer of the layered aluminum fine particles.

FIG. 5 is the electron diffraction pattern of the surface layer of the generated fine particles. Because the thickness of the surface layer is only a few nanometers, it is difficult to measure the diffraction pattern for just this portion, but it was found that the diffraction spots appearing in the figure can be explained as diffraction spots from the fcc (111) plane of aluminum single crystals, and diffraction spots from γ-alumina (publication 4). It was concluded from these results that the surface layer of the generated fine particles was γ-alumina.

It can be seen from the above results that the generated aluminum fine particles were spherical aluminum single crystal fine particles (layered aluminum fine particles) in which the surface layer was covered with γ-alumina in a thickness of a few nanometers (1 to 5 nm).

Because the layered aluminum fine particles generated with the present invention have an interior composed of conductive metallic aluminum and a surface layer composed of insulating alumina, a microscopic capacitor can be constructed by bringing a metal into contact with the surface of the fine particles. With a nanometer-scale capacitor such as this, the passage of a single electron through the insulation layer (single electron tunneling) can be observed, which means that it is possible to make a quantum device such as a transistor that utilizes this effect (publications 1 and 2). Electronic devices such as this will likely be of great import in the future, and as can be seen from the above, the layered aluminum fine particles generated with the present invention should be usable for elements in devices such as this.

For layered aluminum fine particles to be utilized as quantum device elements, it is important that the layered structure thereof (a structure in which the metallic aluminum is covered with alumina) be preserved after deposition onto the substrate. As is clear from the above-mentioned TEM images, with the method of the present invention the fine particles are deposited on the substrate with their spherical shape still in tact. This is because the generated fine particles are placed in a flow of helium gas, released into a vacuum, and deposited on the substrate at a low energy level of about 0.03 eV (no more than 0.05 eV) per constituent atom of the fine particles.

To summarize the above, it was found that layered aluminum fine particles are generated by a magnetron gas aggregation method. On the basis of TEM images and electron beam diffraction analysis, it was found that the generated fine particles are spherical in shape, with a diameter of about 5 to 500 nm, and have a two-layer structure in which the surface layer is composed of γ-alumina and the interior of single crystals of metallic aluminum.

It was also found that layered aluminum fine particles can be generated by either of two types of method, namely, setting the distance between the aluminum target and the particle generating source outlet to about 100 mm and cooling the vicinity of the outlet with liquid nitrogen, or not cooling with liquid nitrogen, and shortening the distance between the target and the outlet to about 30 to 50 mm.

It was proven that the use of helium gas in the conveyance of the fine particles and their deposition onto the substrate allows the fine particles to be deposited onto the substrate with their spherical shape in tact at a low energy level of no more than 0.05 eV per constituent atom of the fine particles.

As detailed above, metallic aluminum is supplied into a mixed gas of helium and $1 \times 10^{-7}$ to $3 \times 10^{-7}$ torr water vapor by sputtering induced by argon gas discharge to generate aggregates by impact with the helium yielding aluminum fine particles (single crystals). The surface of the fine particles is oxidized into a surface layer of alumina through the action of the trace amount of water vapor contained in the helium gas here, and this is how layered aluminum fine particles are produced. Also, the present invention pertains to a method for groducing layered aluminum fine particles with a particle diameter of 5 to 500 nm, characterized in that the above-mentioned particles are placed in a flow of helium gas, released into a vacuum via an aperture, and deposited directly onto a substrate; a method for producing the above-mentioned layered aluminum fine particles, in which the vicinity of the outlet from the particle generating source is cooled with liquid nitrogen, or the distance between the aluminum target and the aperture is set at 30 to 50 mm; or the like. The following merits are realized with the present invention.

(1) Layered aluminum fine particles with a diameter of 5 to 500 nm, which are useful for a quantum device element that utilizes single electron tunneling, can be generated efficiently.

(2) Low-energy layered aluminum fine particles can be deposited onto a substrate with their layered structure and their spherical shape still in tact. As a result, these fine particles can be utilized efficiently as quantum device elements.

Reference Publications

1. S. Ueda: Oyo Butsuri, 62, 889 (1993).
2. R. Wilkins, E. Ben-Jacob, and R.C. Jaklevic: Phys. Rev. Lett., 63, 801 (1989).
3. Solid Physics and Metal Physics Seminars Special Edition, "Ultrafine Particles," p. 68, "5. Generation of Ultrafine Particles," Agne Technology Center (1984)
.4. S. Wilson and J. McConnel, Solid State Chem., 34, 315 (1980).

What is claimed is:

1. Spherical metallic fine particles with diameters of 5 to 500 nm of single crystal aluminum having a surface layer of alumina obtained by a method which comprises:
   (a) generating aluminum from an aluminum target by argon gas discharge-induced sputtering;
   (b) introducing said aluminum into a mixed gas of water vapor at a pressure of $1 \times 10^{-7}$ to $3 \times 10^{-7}$ torr, and helium to generate aluminum particles aggregated; and
   (c) introducing the particles into a vacuum to generate the single crystal aluminum having a surface layer of alumina.

2. Spherical metallic fine particles with diameters of 5 to 500 nm of single crystal aluminum having a surface layer of alumina deposited onto a substrate, obtained by a method which comprises introducing the particles obtained by the method of claim 1 into a vacuum via an aperture by a flow of helium gas to deposit the particles directly onto the substrate.

3. The spherical metallic fine particles of single crystal aluminum having a surface layer of alumina and having a particle diameter of 5 to 500 nm deposited onto the substrate of claim 2, wherein either a vicinity of the aperture is cooled with liquid nitrogen, or a distance between the aluminum target and the aperture is set at a distance from 30 to 50 nm.

4. A single electron tunneling quantum device element containing the spherical metallic fine particles of single crystal aluminum having a surface layer of alumina and having a particle diameter of 5 to 500 nm obtained by the method of claim 1 and a metal being in contact with the surface of the fine particles.

5. A single electron tunneling quantum device element containing the spherical metallic fine particles of single crystal aluminum having a surface layer of alumina and having a particle diameter of 5 to 500 nm deposited onto a substrate obtained by the method of claim 2 and a metal being in contact with the surface of the fine particles.

6. A single electron tunneling quantum device element containing the spherical metallic fine particles of single crystal aluminum having a surface layer of alumina and having a particle diameter of 5 to 500 nm deposited onto a substrate obtained by the method of claim 3 and a metal being in contact with the surface of the fine particles.

* * * * *